US009868256B2

(12) United States Patent
Tseng

(10) Patent No.: US 9,868,256 B2
(45) Date of Patent: Jan. 16, 2018

(54) THREE-DIMENSIONAL PRINTING SYSTEM AND METHOD FOR THREE-DIMENSIONAL PRINTING

(71) Applicant: SILICON TOUCH TECHNOLOGY INC., Hsinchu (TW)

(72) Inventor: Ling-Yuan Tseng, Hsinchu (TW)

(73) Assignee: SILICON TOUCH TECHNOLOGY INC., Hsinchu (TW)

( * ) Notice: Subject to any disclaimer, the term of this patent is extended or adjusted under 35 U.S.C. 154(b) by 555 days.

(21) Appl. No.: 14/077,184

(22) Filed: Nov. 11, 2013

(65) Prior Publication Data

US 2015/0081080 A1 Mar. 19, 2015

(30) Foreign Application Priority Data

Sep. 13, 2013 (TW) .............................. 102133280 A

(51) Int. Cl.
*B29C 67/00* (2017.01)
*G06T 1/00* (2006.01)
(Continued)

(52) U.S. Cl.
CPC ............ *B29C 67/0088* (2013.01); *G02B 7/36* (2013.01); *G06F 17/50* (2013.01); *G06T 1/0007* (2013.01)

(58) Field of Classification Search
CPC ............................... G06F 17/50; G06T 1/0007
(Continued)

(56) References Cited

U.S. PATENT DOCUMENTS

| 5,151,609 A | 9/1992 | Nakagawa et al. |
| 6,344,930 B1 | 2/2002 | Kaneko et al. |

(Continued)

FOREIGN PATENT DOCUMENTS

| DE | 102004047928 | 4/2006 | |
| DE | 102004047928 A1 * | 4/2006 | ............. G01B 11/24 |

(Continued)

OTHER PUBLICATIONS

Rioux, "Digital 3-D Imaging: Theory and Applications" Proc. SPIE 2350, Videometrics III, vol. 2 (Oct. 6, 1994) pp. 2-15.*
(Continued)

*Primary Examiner* — Emilio J Saavedra
(74) *Attorney, Agent, or Firm* — JCIPRNET

(57) ABSTRACT

A three-dimensional printing system includes a light source unit, at least one image-capturing module, a processing unit and a printing device. The image-capturing module includes an image-capturing unit and a focus-adjusting lens group. The processing unit controls a zooming lens to change a shooting focal length and controlling multiple images of the object to be measured captured by the image-capturing unit under the different shooting focal lengths, wherein each of the plural images includes focused and unfocused local images therein, and the processing unit calculates out a three-dimensional profile data of the object to be measured according to the focused local images in the images and the shooting focal lengths corresponding to the focused local images. The printing device prints multiple cross-sectional profiles corresponding to the object to be measured. Further, a method for three-dimensional printing is also provided.

13 Claims, 11 Drawing Sheets

(51) Int. Cl.
*G06F 17/50* (2006.01)
*G02B 7/36* (2006.01)

(58) Field of Classification Search
USPC .................................................. 700/119, 118
See application file for complete search history.

(56) References Cited

U.S. PATENT DOCUMENTS

| | | | |
|---|---|---|---|
| 6,947,582 | B1 | 9/2005 | Vilsmeier et al. |
| 7,724,347 | B2 | 5/2010 | Tseng et al. |
| 8,100,539 | B2 | 1/2012 | Tseng et al. |
| 2002/0071125 | A1 | 6/2002 | Sieckmann |
| 2006/0239588 | A1* | 10/2006 | Hull .................. B29C 67/0055 382/285 |
| 2008/0258339 | A1 | 10/2008 | Conrad |
| 2013/0138234 | A1 | 5/2013 | Dufort et al. |

FOREIGN PATENT DOCUMENTS

| | | |
|---|---|---|
| JP | S63236627 | 10/1988 |
| JP | H0926312 | 1/1997 |
| JP | H09145318 | 6/1997 |
| JP | 2002113786 | 4/2002 |
| JP | 2004309426 | 11/2004 |
| JP | 2005139593 | 6/2005 |
| JP | 2008518290 | 5/2008 |
| TW | I253379 | 4/2006 |
| TW | M315846 | 7/2007 |
| TW | 320078 | 10/2007 |
| TW | M320088 | 10/2007 |
| TW | M327490 | 2/2008 |
| TW | M329797 | 4/2008 |
| TW | 200903378 | 1/2009 |
| TW | I349477 | 9/2011 |
| WO | 2008109908 | 9/2008 |

OTHER PUBLICATIONS

Qu et al., "Combination of a vision system and a coordinate measuring machine for rapid coordinate metrology" Proc. SPIE 4927, Optical Design and Testing, (2002) pp. 581-585.*

Li et al., "Measurement of three-dimensional profiles with structure linear lighting" Robotics and Computer Integrated Manufacturing vol. 19 (2003) pp. 493-499.*

Huber et al., "3D light scanning macrography" Journal of Microscopy, vol. 203, Pt 2, Aug. 2001, pp. 208-213.*

Bradley et al., "A Simple, Low Cost, 3D Scanning System Using the Laser Light-Sectioning Method" FMTC 2008—IEEE International Instrumentation and Measurement Technology Conference Victoria, Vancouver Island, Canada, May 12-15, 2008, 6 Pgs.*

Sturm et al., "CopyMe3D: Scanning and Printing Persons in 3D," Lecture Notes in Computer Science; Springer Verlag, Sep. 3, 2013, pp. 405-414.

Yang et al., "Confocal Microscopy Using Variable-focal-length Microlenses and an Optical Fiber Bundle," Applied Optics, Oct. 1, 2005, pp. 5928-5936.

Winder et al., "Medical Rapid Prototyping Technologies: State of the Art and Current Limitations for Application in Oral and Maxillofacial Surgery," Journal of Oral and Maxillofacial Sugery, Jul. 1, 2005, pp. 1006-1015.

Matsumoto et al., "A Portable Three-dimensional Digitizer," Proceedings of International Conference on Recent Advances in 3-D Digital Imaging and Modeling, May 12-15, 1997, pp. 197-204.

Jiang Yu Zheng, "Acquiring 3-D Models from Sequences of Contours," IEEE Transactions on Pattern Analysis and Machine Intelligence, Feb. 1994, pp. 163-178.

Zhengyou Zhang, "Microsoft Kinect Sensor and Its Effect," IEEE MultiMedia, Feb. 1, 2012, pp. 4-10.

Jungong Han, et al., "Enhanced Computer Vision with Microsoft Kinect Sensor: A Review" PrePrint IEEE Transactions on Cybernetics, IEEE, US, Jan. 1, 2013, pp. 1-17. (Ref. 4).

Oxford English Dictionary, "Profile, n." Retrieved on Apr. 11, 2016, pp. 1-8. (Ref. 5).

"Office Action of China Counterpart Application," dated Apr. 13, 2016, p. 1-p. 11, in which the listed reference (Ref. 1) was cited.

"Office Action of Japanese Counterpart Application," dated Apr. 19, 2016, p. 1-p. 3, in which the listed references (Ref. 2-3) were cited.

"Office Action of European Counterpart Application," dated Apr. 26, 2016, p. 1-p. 9, in which the listed references (Ref. 4-5) were cited.

"Office Action of Taiwan Counterpart Application", dated Mar. 1, 2016, p. 1-p. 8, in which the listed references were cited.

F. Rengier et al., "3D printing based on imaging data: review of medical applications," Int. J. Computer Assisted Radiology and Surgery, May 2010, pp. 335-341.

* cited by examiner

US 9,868,256 B2

THREE-DIMENSIONAL PRINTING SYSTEM AND METHOD FOR THREE-DIMENSIONAL PRINTING

CROSS-REFERENCE TO RELATED APPLICATION

This application claims the priority benefit of Taiwan application serial no. 102133280, filed on Sep. 13, 2013. The entirety of the above-mentioned patent application is hereby incorporated by reference herein and made a part of this specification.

BACKGROUND OF THE INVENTION

Field of the Invention

The invention generally relates to a printing system and a printing method, and more particularly, to a three-dimensional printing system and a method for three-dimensional printing.

Description of Related Art

Along with the staggering advancements of science and technology today, people are no longer satisfied with the two-dimensional copying technology. In recent years, solid printing technology, namely three-dimensional (3D) printing technology makes a solid object can also be printed for reproduction, which thus is able to quickly and inexpensively mass-produce products.

The 3D printing technology can be used in mold manufacturing, industrial design and other fields in order to create models. In recent years, some products are also directly manufactured with the 3D printing technology. In particular, for some high-value applications (such as hip or teeth, or some aircraft parts), the 3D printing technology have been used to make the above-mentioned parts. In general, the three-dimensional printing technology design process is: first, through a computer-aided design (CAD) or a computer animation modelling software, performing modelling; and then, slicing the built 3D model into a plurality of cross-sectional layers so as to guide a printer for printing layer by layer.

However, for an existed physical object, people need to additionally use artificial means and through a CAD or a computer animation modelling software to scan the physical object followed by performing 3D printing. In this way, not only it is difficult to improve the accuracy of the reproduction, but also it spends additional time and labor, thereby increases the cost of reproduction. Therefore, how to accurately and efficiently obtain the profile of an object to be reproduced has become one of the issues to be solved in the three-dimensional printing technology now.

SUMMARY OF THE INVENTION

Accordingly, the invention is directed to a three-dimensional printing system and a method for three-dimensional printing, which are able to accurately and efficiently obtain the profile of an object to be measured.

An embodiment of the invention provides a three-dimensional printing system includes a light source unit, at least one image-capturing module, a processing unit and a printing device. The light source unit is configured to illuminate an object to be measured. The image-capturing module includes an image-capturing unit and a focus-adjusting lens group. The image-capturing unit is disposed at a side of the object to be measured, and the focus-adjusting lens group is disposed between the image-capturing unit and the object to be measured. The processing unit controls the focus-adjusting lens group to change shooting focal lengths and controls the image-capturing unit to capture a plurality of images of the object to be measured captured under the different shooting focal lengths, wherein each of the plural images includes a focused and an unfocused local image therein, and the processing unit calculates out a three-dimensional profile data of the object to be measured according to the focused local images in the images and the shooting focal lengths corresponding to the focused local images. The printing device prints a plurality of cross-sectional profiles corresponding to the object to be measured.

In an embodiment of the invention, the light source unit provides the object to be measured with an illumination light, the object to be measured is opaque relatively to the illumination light, the focused local images are images of overlapped portions of the object to be measured and the focus planes under the different shooting focal lengths, where the three-dimensional profile data includes an information of a surface profile of the object to be measured.

In an embodiment of the invention, the image-capturing module shoots the object to be measured with at least one shooting optical axis, a minimal value of the shooting focal lengths is a shortest distance between the focus-adjusting lens group and the object to be measured along the shooting optical axis, and a maximal value of the shooting focal lengths is a distance between the focus-adjusting lens group and the focus plane along the shooting optical axis when an overlapped cross-section area of the object to be measured and the focus plane P is maximal.

In an embodiment of the invention, the light source unit provides the object to be measured with an illumination light, the object to be measured is transparent relatively to the illumination light, images of overlapped portions of the object to be measured and the focus planes under the different shooting focal lengths, where the three-dimensional profile data includes an information of a surface profile and an inner shape of the object to be measured.

In an embodiment of the invention, the image-capturing module shoots the object to be measured with at least one shooting optical axis, a minimal value of the shooting focal lengths is a shortest distance between the focus-adjusting lens group and the object to be measured along the shooting optical axis, and a maximal value of the shooting focal lengths is a longest distance between the focus-adjusting lens group and the object to be measured along the shooting optical axis.

In an embodiment of the invention, the at least one image-capturing module is a plurality of image-capturing modules respectively disposed surrounding the object to be measured, in which the image-capturing modules respectively capture at least a portion of the images of the object to be measured with different shooting optical axes.

In an embodiment of the invention, the processing unit maps the focused local images among the images of the object to be measured captured by the image-capturing unit under the different shooting focal lengths respectively to a driving unit of the printing device, and the driving unit performs printing according to the mapped focused local images among the images.

In an embodiment of the invention, the driving unit performs image scaling and printing according to the focused local images among the mapped images.

An embodiment of the invention provides a method for three-dimensional printing, which includes: illuminating an object to be measured; capturing a plurality of images of the object to be measured under different shooting focal lengths, in which each of the images includes a focused local image and an unfocused local image; calculating out a three-dimensional profile data of the object to be measured according to the focused local images in the images and according to the shooting focal lengths corresponding to the focused local images; and printing a plurality of cross-sectional profiles corresponding to the object to be measured according to the three-dimensional profile data.

In an embodiment of the invention, the object to be measured is opaque relatively to the illumination light illuminated on the object to be measured, the focused local images are images of overlapped portions of the object to be measured and the focus planes under the different shooting focal lengths, where the three-dimensional profile data includes the surface profile of the object to be measured.

In an embodiment of the invention, the step of capturing the plurality of images of the object to be measured under the different shooting focal lengths further includes: shooting the object to be measured with at least one shooting optical axis through at least one image-capturing module, a minimal value of the shooting focal lengths is a shortest distance between the focus-adjusting lens group of the image-capturing module and the object to be measured along the shooting optical axis, and a maximal value of the shooting focal lengths is a distance between the focus-adjusting lens group and the focus plane along the shooting optical axis when an overlapped cross-section area of the object to be measured and the focus plane P is maximal.

In an embodiment of the invention, the object to be measured is transparent relatively to the illumination light illuminated on the object to be measured, the focused local images are images of overlapped portions of the object to be measured and the focus planes under the different shooting focal lengths, and the three-dimensional profile data includes an information of a surface profile and an inner shape of the object to be measured.

In an embodiment of the invention, the step of capturing the plurality of images of the object to be measured under the different shooting focal lengths further includes: shooting the object to be measured with at least one shooting optical axis through at least one image-capturing module, a minimal value of the shooting focal lengths is a shortest distance between the focus-adjusting lens group of the image-capturing module and the object to be measured along the shooting optical axis, and a maximal value of the shooting focal lengths is a longest distance between the focus-adjusting lens group and the object to be measured along the shooting optical axis.

In an embodiment of the invention, the method for three-dimensional printing further includes: mapping the focused local images among the images of the object to be measured captured under the different shooting focal lengths respectively to a driving unit of a printing device, and the driving unit performs printing according to the mapped focused local images among the images.

In an embodiment of the invention, the driving unit performs image scaling and printing according to the mapped focused local images among the images.

Based on the depiction above, by using the three-dimensional printing system and the method for three-dimensional printing in the embodiments of the invention, the three-dimensional profile data such as the profile and the shape of an object to be measured can be accurately and effectively obtained and the finished products can be fast and accurately reproduced so as to advance the product quality and reduce the production cost.

In order to make the features and advantages of the present invention more comprehensible, the present invention is further described in detail in the following with reference to the embodiments and the accompanying drawings.

DESCRIPTION OF THE EMBODIMENTS

Figure 1A:
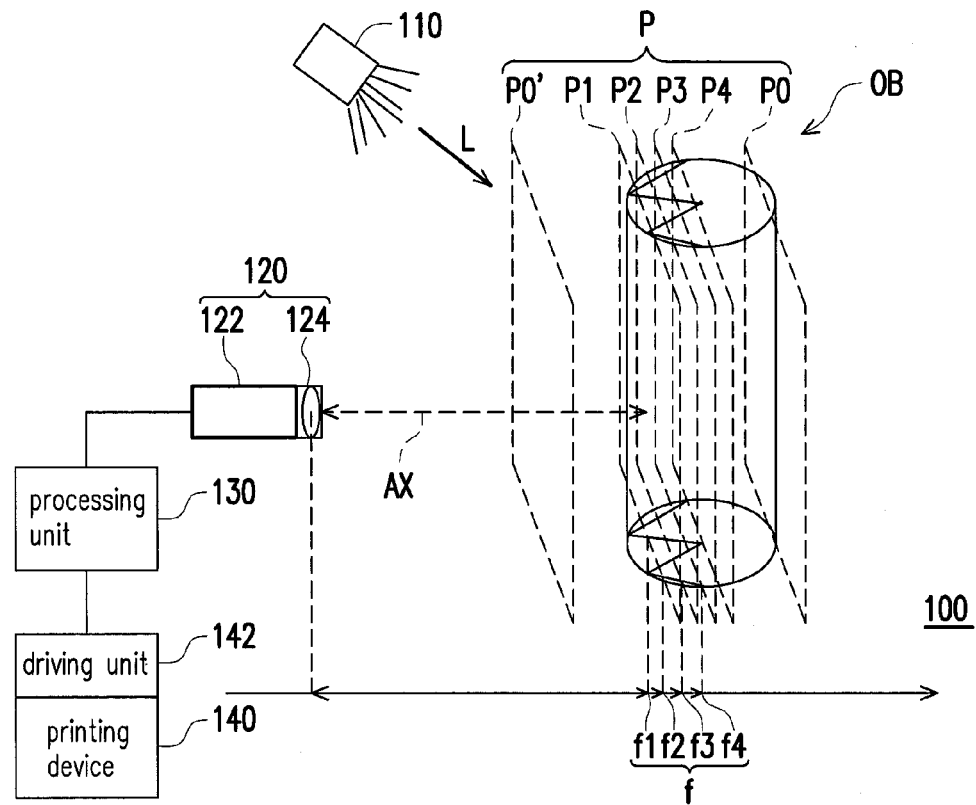
FIG. 1A is a schematic diagram of a three-dimensional printing system in the first embodiment of the invention.

FIG. 1A is a schematic diagram of a three-dimensional printing system in the first embodiment of the invention. Referring to FIG. 1A, in the embodiment, a three-dimensional printing system 100 includes a light source unit 110, at least one image-capturing module 120, a processing unit 130 and a printing device 140.

The light source unit 110 is configured to illuminate an object to be measured OB. The image-capturing module 120 includes an image-capturing unit 122 and a focus-adjusting lens group 124. The image-capturing unit 122 is disposed at a side of the object to be measured OB and the focus-adjusting lens group 124 is disposed between the image-capturing unit 122 and the object to be measured OB. The processing unit 130 controls the focus-adjusting lens group 124 to change the shooting focal length f (such as the focal lengths f1, f2, f3 and f4 in FIG. 1A) and controls the image-capturing unit 122 to capture the plural images of the object to be measured OB under the different shooting focal lengths f, wherein the shape of the object to be measured OB, the size and the distances and the relative positions of the parts in FIG. 1A are examples only to explain the embodiment, which the invention is not limited to.

Each of the images includes a focused and an unfocused local image, and the processing unit 130 calculates the three-dimensional profile data of the object to be measured OB according to the focused local images in the images and the shooting focal lengths f corresponding to the focused local images. The printing device 140 prints plural corresponding cross-sectional profiles of the object to be measured OB according to the three-dimensional profile data. The focused and unfocused local images and the cross-sectional profiles are described in followings.

Continuing to FIG. 1A, in the embodiment, the light source unit 110 provides the object to be measured OB with an illumination light L, in which the object to be measured OB, relatively to the illumination light, is opaque. For example, the illumination light L can be visible light, while the object to be measured OB can be an opaque material, which the invention is not limited to.

In the embodiment, the image-capturing unit 122 can be a light detector or an image detector of charge coupled device (CCD) or complementary metal-oxide semiconductor (CMOS) able to be used to sense graylevel images or color images, which the invention is not limited to.

Figure 1B:
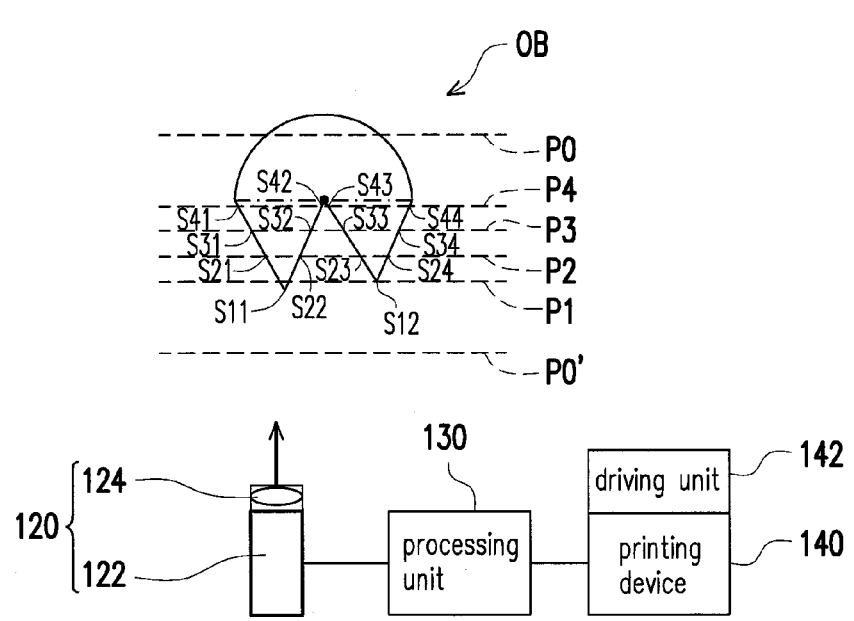
FIG. 1B is a top-view diagram of the three-dimensional printing system in the embodiment of FIG. 1A.

FIG. 1B is a top-view diagram of the three-dimensional printing system in the embodiment of FIG. 1A. Referring to FIGS. 1A and 1B, in the embodiment, since the shooting focal length f of the focus-adjusting lens group 124 is adjustable, the focus-adjusting lens group 124 can adjust the focus plane P of shooting (such as the focus planes P1, P2, P3 and P4 in FIG. 1A). The images on the focus planes P of shooting can be focused so as to be clearly captured by the image-capturing module 120, while the images without being on the focus planes P of shooting are vague images due to not being focused, although they can be captured. Thus, the processing unit 130 can select an appropriate image edge algorithm depending on the accuracy requirement to determine and decide which of the images are focused local images or unfocused local images.

Continuing to FIGS. 1A and 1B, in the embodiment, the image-capturing module 120 shoots the object to be measured OB with a shooting optical axis AX, the minimal value of the shooting focal lengths f can be the shortest distance between the focus-adjusting lens group 124 and the object to be measured OB along the shooting optical axis AX. The maximal value of the shooting focal lengths f is a distance between the focus-adjusting lens group 124 and the focus plane P along the shooting optical axis AX where the overlapped cross-section area of the object to be measured OB and the focus plane P is maximal (for example, at the focus plane P4 in FIG. 1A).

Since the object to be measured OB relatively to the illumination light L is opaque in the embodiment, so that even further increasing the shooting focal length f (for example, increasing the focal length until reaching the focus plane P0) at the places where the overlapped cross-section area of the object to be measured OB and the focus plane P is maximal, it is not possible to capture a clear local image. On the other hand, when the shooting focal length is shorter than the shortest distance between the focus-adjusting lens group 124 and the object to be measured OB along the shooting optical axis AX (for example, decreasing the focal length until reaching the focus plane P0'), since the focus plane P0' is not overlapped with the object to be measured OB, it is not possible to capture a clear local image as well.

Figure 2A:
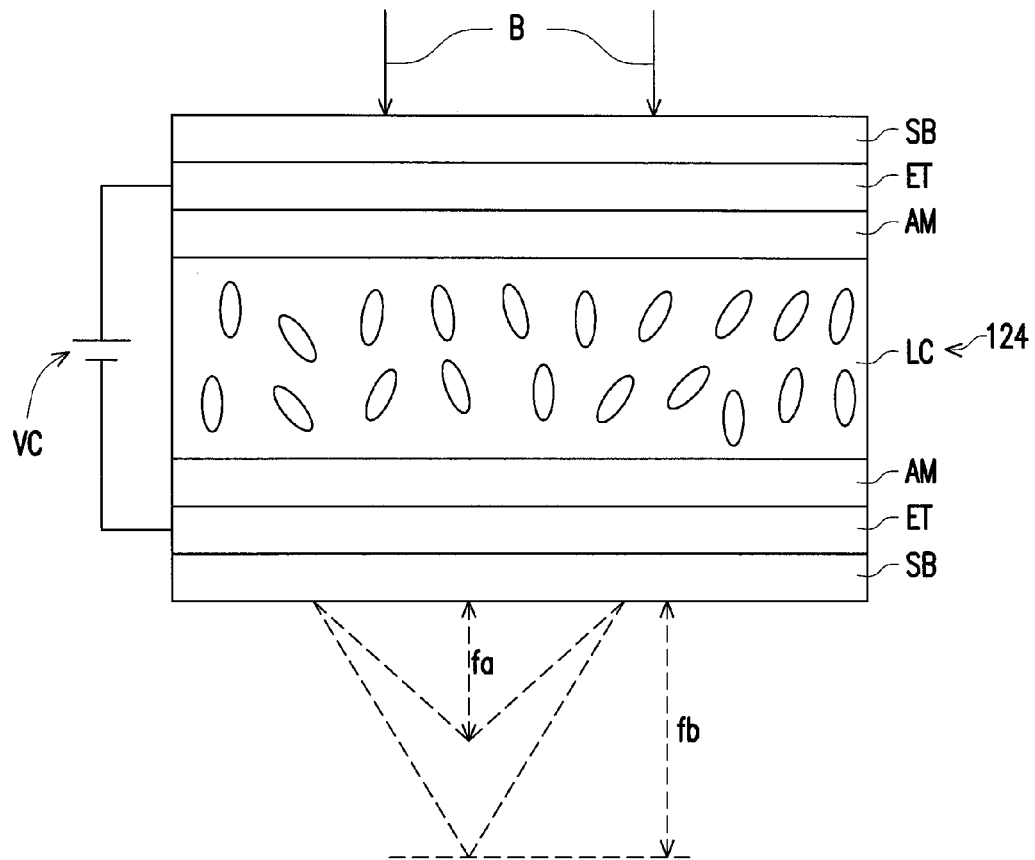
FIG. 2A is an implementation diagram of the focus-adjusting lens group in the embodiment of FIG. 1A.
Figure 2B:
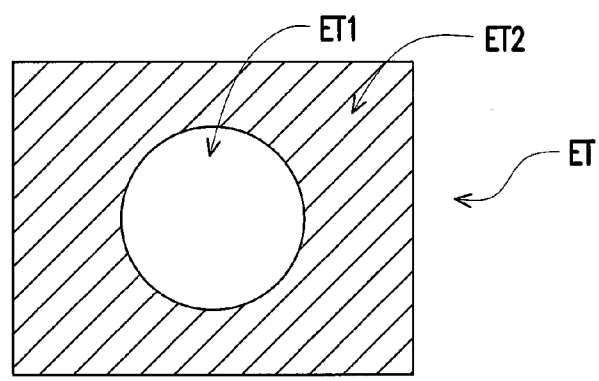
FIG. 2B is a top-view diagram of the electrode layer ET in the embodiment of FIG. 2A.

FIG. 2A is an implementation diagram of the focus-adjusting lens group in the embodiment of FIG. 1A and FIG. 2B is a top-view diagram of the electrode layer ET in the embodiment of FIG. 2A. Referring to FIGS. 2A and 2B, for example in the embodiment, the focus-adjusting lens group 124 can include liquid crystal zoomy lenses, i.e., as shown in FIGS. 2A and 2B, a liquid crystal layer LC is sandwiched by two layers, wherein each of the two layers respectively includes a transparent substrate SB (for example, a transparent material such as a glass substrate), an electrode layer ET (for example, a transparent electrode layer formed by a transparent conductive material coated with indium tin oxide (ITO)) and a substrate of an alignment layer AM. The light beam B becomes convergent after passing through the focus-adjusting lens group 124.

In general, when the liquid crystal layer LC is not affected by an applied electric field, the liquid crystal molecules near to the alignment layer would be arranged in the alignment orientation of the alignment layer AM so that the light B passing through the focus-adjusting lens group 124 is refracted and becomes convergent at, for example, the position of the focal length fa.

On the other hand, when a voltage source VC applies a voltage on the up and down to electrode layers ET in FIG. 2A, the liquid crystal layer LC is affected by an applied electric field (affected by a voltage in an electric direction from up to down), the liquid crystal molecules in the liquid crystal layer LC would follow the direction of the applied electric field to change the orientation thereof. As a result, the refractive power of the liquid crystal molecules affected by the applied electric field gets weaker relatively to the light beam B incident to the focus-adjusting lens group 124 and thus the overall focal length of the focus-adjusting lens group 124 gets longer (for example, the focal length fa is changed to the focal length fb).

Moreover, in order to make the light beam B after passing through the focus-adjusting lens group 124 converged to a specific light-radiation pattern according to the design, the electrode layer ET can be designed as follows, as shown in FIG. 2B. In the embodiment, the electrode layer ET is not entirely coated with the transparent conductive material, in fact, it is partially coated only.

For example, as shown in FIG. 2B, the portion of the round electrode layer region ET1 in the electrode layer ET of the embodiment is not coated with the transparent conductive material, but the portion of the electrode layer region ET2 in the electrode layer ET is coated with the transparent conductive material only. Thus, since the electrode layer region ET2 is not applied by the voltage, when the voltage source VC applies a voltage on the electrode layer ET, since the intensity of the overall applied electric field decays from the peripheral (corresponding to the electrode layer region ET1) to inner region (corresponding to the electrode layer region ET2), the focus-adjusting lens group 124 establishes a progressive refractive index distribution (in the peripheral, the refractive index corresponding to the electrode layer region ET1 on the light beam B is smaller, while in the inner region, the refractive index corresponding to the electrode layer region ET2 on the light beam B is larger) so as to meet the needs of the focusing effect.

It should be noted that the structures of the disposing shape, sizes and relative positions of the parts such as the above-mentioned electrode layer regions ET1 and ET2 are examples only to explain the embodiment. In other embodiments, they can have different designs depending on the need, which the invention is not limited to.

In short, by changing the parameters such as the value and direction of the applied electric field, the focal length of the focus-adjusting lens group 124 can be precisely adjusted without additional actions so as to accurately and fast make zooming without wears of the moving parts.

In other embodiments, the focus-adjusting lens group 124 can be implemented with other structures, for example, a voice coil motor (VCM) can be used. In addition, in other embodiments, the focus-adjusting lens group 124 can include a fixed-focus lens (not shown) as well. By moving the fixed-focus lens manually or automatically to change the focal length can also achieve the effect same as or similar to the focus-adjusting lens group 124, which the invention is not limited to.

FIGS. 3A-3D are diagrams showing the images captured by the image-capturing module 120 respectively under four focal lengths f1, f2, f3 and f4. Referring to FIGS. 1A-3D, in more details, in the embodiment, the focused local images are the images of the portions of the object to be measured OB overlapped with the focus plane P under the different shooting focal lengths f. The three-dimensional profile data includes the surface profile of the object to be measured OB.

Figure 3A:
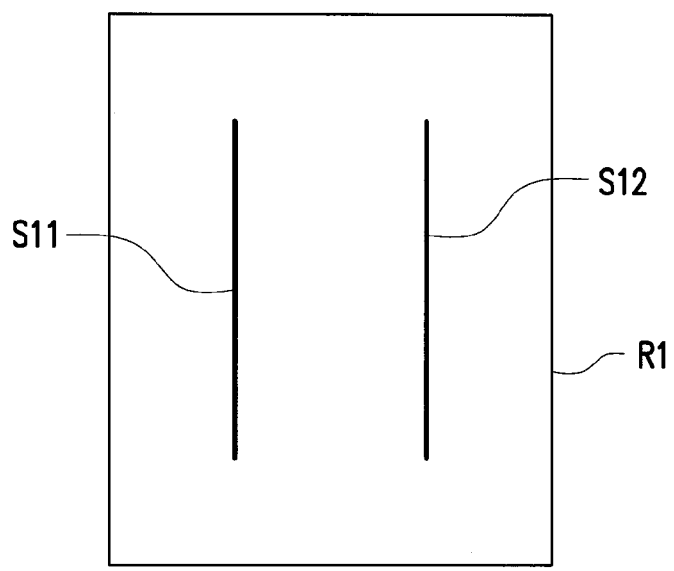
FIGS. 3A-3D are diagrams showing the images captured by the image-capturing module 120 respectively under four focal lengths f1, f2, f3 and f4.

Further referring to FIGS. 1B and 3A first. FIG. 3A is a diagram of the image R1 captured by the image-capturing module 120 at the focus plane P1 after being processed by the processing unit 130. It can be seen from FIGS. 1B and 3A that the portion of the object to be measured OB overlapped with the focus plane P1, i.e., the local images S11 and S12 in FIGS. 1B and 3A can be distinctly identified, while the portion of the object to be measured OB not overlapped with the focus plane P1 becomes vague local images due to being unfocused. Therefore, the vague images can be filtered out after processing the image R1 by the processing unit 130.

Figure 3B:
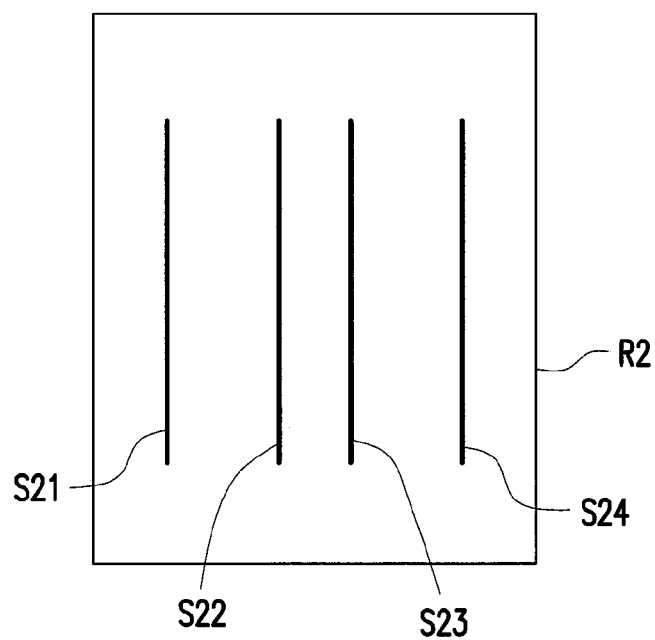

Referring to FIG. 3B which is a diagram of the image R2 captured by the image-capturing module 120 at the focus plane P2 after being processed by the processing unit 130. It can be seen from FIGS. 1B and 3B that the portion of the object to be measured OB overlapped with the focus plane P2, i.e., the local images S21, S22, S23 and S24 in FIGS. 1B and 3B can be distinctly identified, while the vague image portion of the object to be measured OB not overlapped with the focus plane P2 can be filtered out after the processing by the processing unit 130, which is omitted to describe.

Figure 3C:
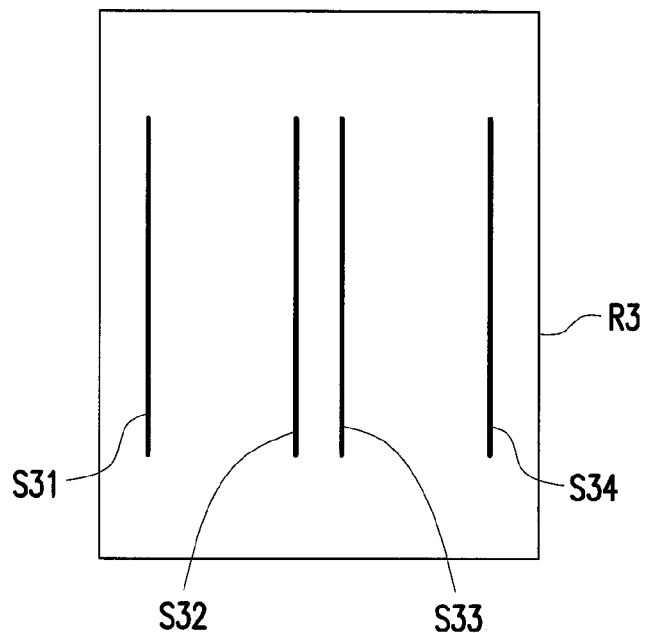

Referring to FIG. 3C which is a diagram of the image R3 captured by the image-capturing module 120 at the focus plane P3 after being processed by the processing unit 130. It can be seen from FIGS. 1B and 3C that the portion of the object to be measured OB overlapped with the focus plane P3, i.e., the local images S31, S32, S33 and S34 in FIGS. 1B and 3C can be distinctly identified, while the vague image portion of the object to be measured OB not overlapped with the focus plane P3 can be filtered out after the processing by the processing unit 130, which is omitted to describe.

Figure 3D:
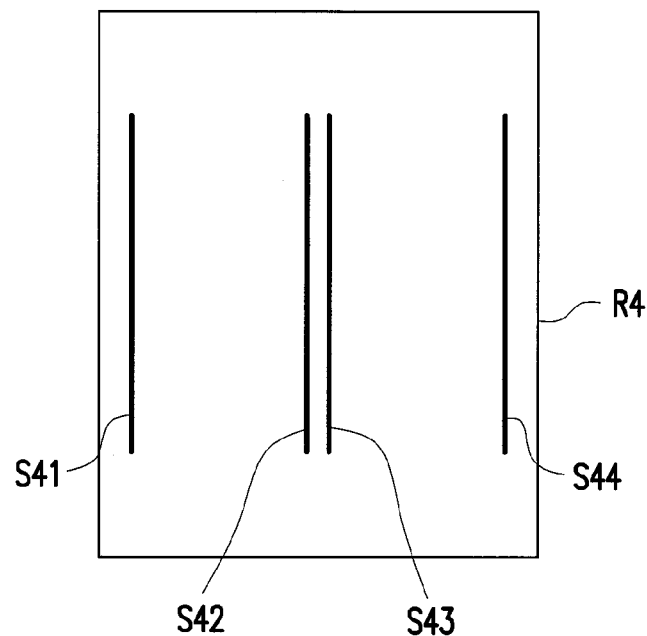

Referring to FIG. 3D which is a diagram of the image R4 captured by the image-capturing module 120 at the focus plane P4 after being processed by the processing unit 130. It can be seen from FIGS. 1B and 3D that the portion of the object to be measured OB overlapped with the focus plane P4, i.e., the local images S41, S42, S43 and S44 in FIGS. 1B and 3D can be distinctly identified, while the vague image portion of the object to be measured OB not overlapped with the focus plane P1 can be filtered out after the processing by the processing unit 130, which is omitted to describe.

In the embodiment, the images R1-R4 captured and processed in the above-mentioned way are equivalent to the vertical slices of the shell of the object to be measured OB on each focus plane P. The focus planes P in FIGS. 1A-3D are, for example, four. In fact, the number of the focus planes P can be increased or reduced depending on the accuracy need. For example, when the number of the focus planes P is large, the surface profile of the object to be measured OB can be quite precisely deducted by the processing unit 130 and recorded as the three-dimensional profile data.

After the images (for example, the images R1-R4) are calculated and recorded by the processing unit 130 to serve as the three-dimensional profile data, the processing unit 130 transmits the three-dimensional profile data to the printing device 140 so that the printing device performs printings in cumulative and stacked way, which is equivalent to print the cross-section profiles corresponding to the surface profile of the object to be measured OB layer by layer. After entirely printing out all the cross-section profiles, the reproduction of the surface profile (i.e., the shell profile thereof) of the object to be measured OB is obtained in cumulative and stacked way. Such a shell reproduction can completely reflect the original surface profile of the object to be measured OB without using CAD or the computer animation modelling software to depict it, which can save the manufacturing time and cost meanwhile keeping a good reproducing accuracy.

It is certain that the three-dimensional printing system 100 in the embodiment can map the three-dimensional profile data of the object to be measured OB depending on the need. The processing unit 130 can respectively map the focused local images among the images of the object to be measured OB captured by the image-capturing unit 122 under the different shooting focal lengths to the driving unit 142 of the printing device 140. The driving unit 142 prints the mapped focused local images among the images, in which the driving unit 142, for example, includes hardware such as a processor (not shown) and a memory (not shown) and software such as a mapping software, an image processing software and a printing software.

Figure 3E:
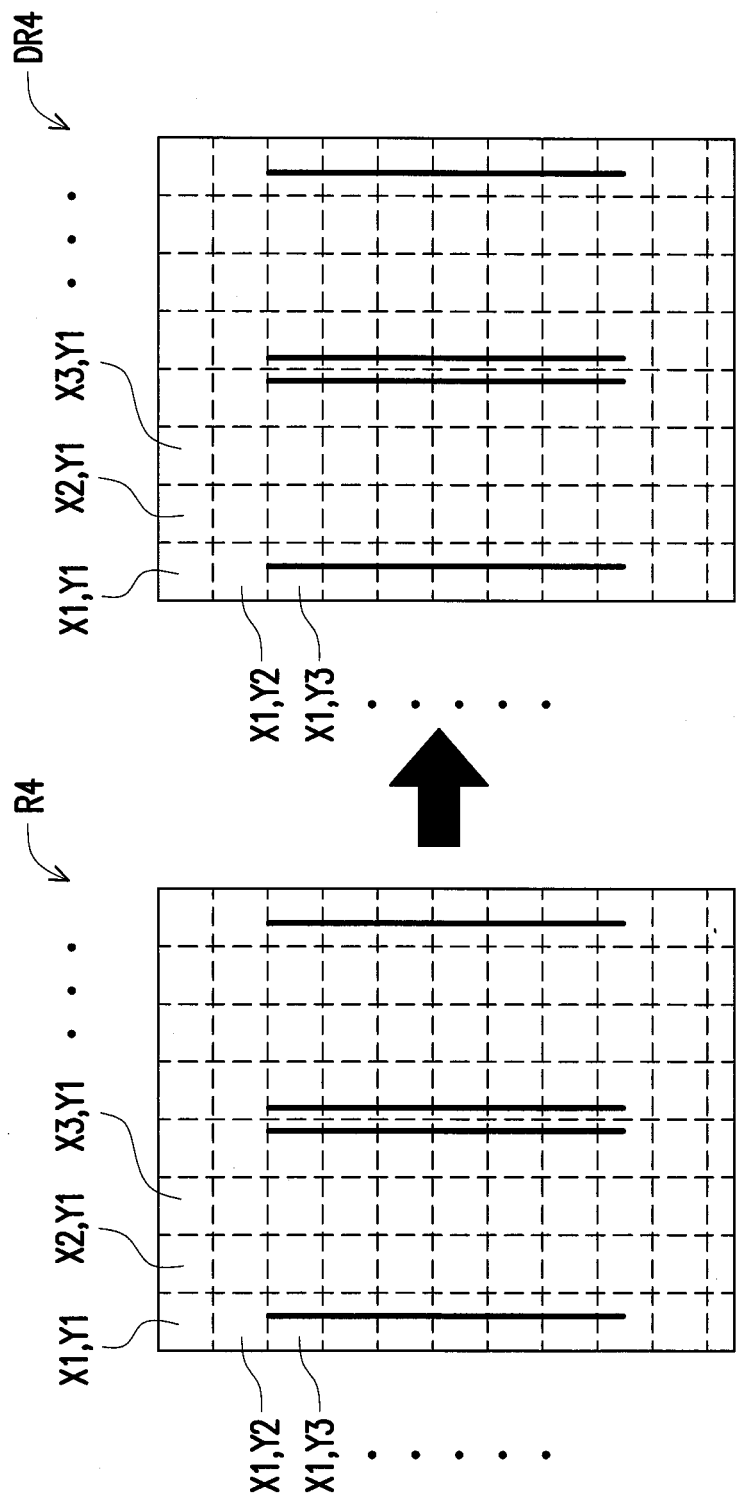
FIG. 3E illustrates mapping an image R4 in FIG. 3D to the driving unit.
Figure 3F:
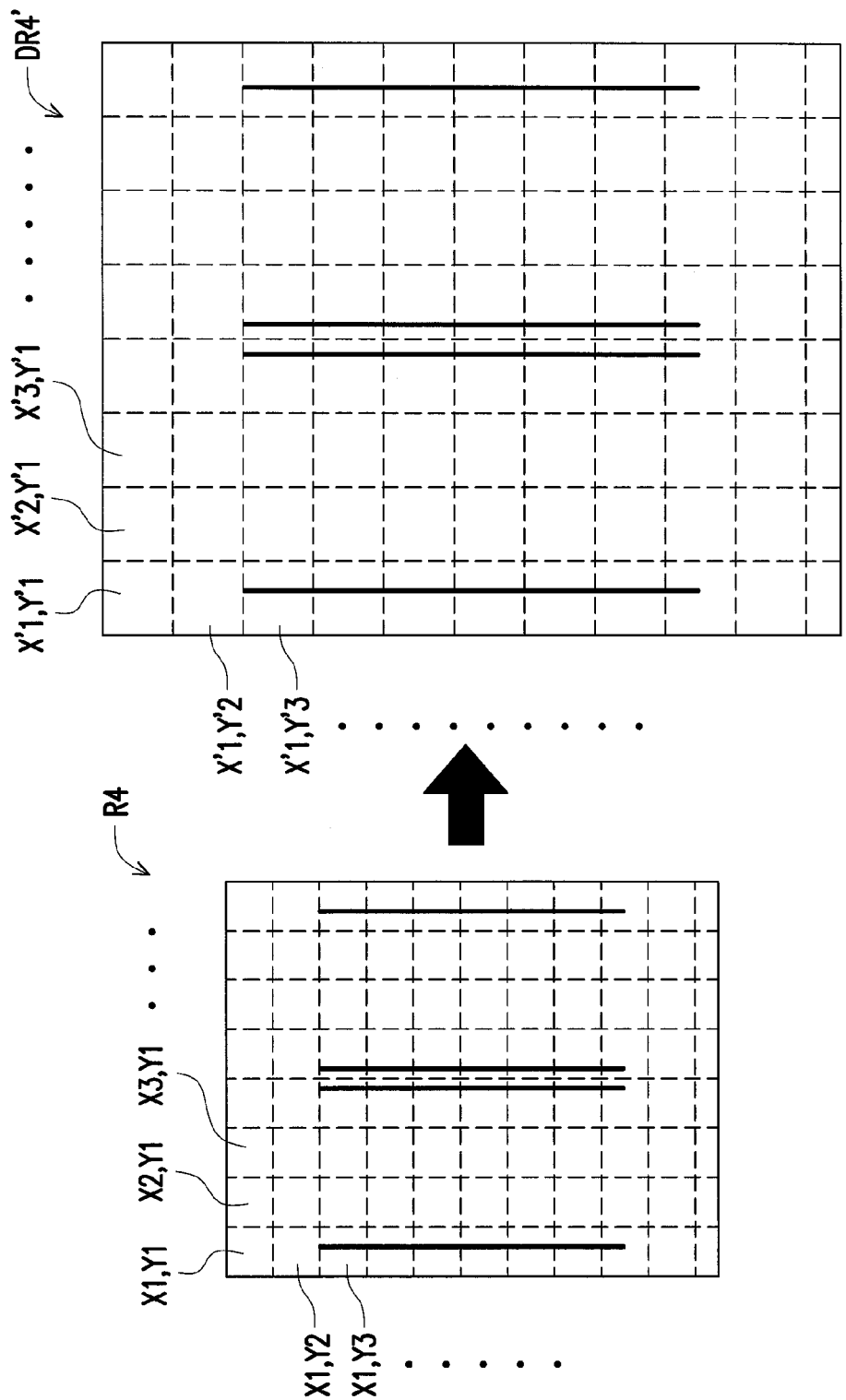
FIG. 3F illustrates performing image scaling on the image R4 in FIG. 3D and mapping R4 to the driving unit.

For example, FIG. 3E illustrates mapping an image R4 in FIG. 3D to the driving unit and FIG. 3F illustrates performing image scaling on the image R4 in FIG. 3D and mapping R4 to the driving unit. Referring to FIGS. 1, 3D and 3E, when the image resolution of the image-capturing unit 122 is the same as the image resolution of the printing device 140, the focused local images (bold line in FIG. 3E) in the image R4 can be mapped by the processing unit 130 to the driving unit 142 in 1:1 proportion to serve as an image DR4. At the time, the pixels (X1, Y1), (X2, Y1), (X3, Y1), (X1, Y2), (X1, Y3) . . . are one by one mapped to the pixels (X1, Y1), (X2, Y1), (X3, Y1), (X1, Y2), (X1, Y3) . . . on the image DR4. Then, the driving unit 142 may drive the printing device 140 to print out the three-dimensional reproduction of the object to be measured OB in proportion of 1:1 according to the image DR4.

In more situations however, the image resolution of the image-capturing unit 122 is inconsistent with the image resolution of the printing device 140. For example, referring to FIG. 3F, when the image resolution of the image-capturing unit 122 is less than the image resolution of the printing device 140, the driving unit 142 can further perform image scaling on the mapped from the processing unit 130. At the time, the pixels (X1, Y1), (X2, Y1), (X3, Y1), (X1, Y2), (X1, Y3) . . . of the image R4 in FIG. 3E are one by one mapped through the image scaling to the pixels (X1', Y1'), (X2', Y1'), (X3', Y1'), (X1' Y2'), (X1', Y3') . . . on the image DR4'. Moreover, the mapped image can be smoothed and edge-sharpened or other image processed in various algorithms so that the driving unit 142 can print out a three-dimensional reproduction of the object to be measured OB in a proportion different from the original size according to the image DR4'.

In addition, in the embodiment, the range of the shooting focal length f of the focus-adjusting lens group 124 is set as above mentioned so as to effectively gradually scan the surface of the object to be measured OB to capture the surface profile of the object to be measured OB. Meanwhile, when the area of the cross-section where the object to be measured OB is overlapped with the focus plane P is the maximal and the place of the maximal area is located at the center region portion of the object to be measured OB, it can, as shown by the architecture of FIG. 1A, measure a half of the profile of the object to be measured OB first, and then, turn over the object to be measured OB relatively to the image-capturing module 120 for 180° so as to scan again the rest half of the object to be measured OB, and finally, the entire surface profile of the overall object to be measured OB is obtained.

Figure 4:
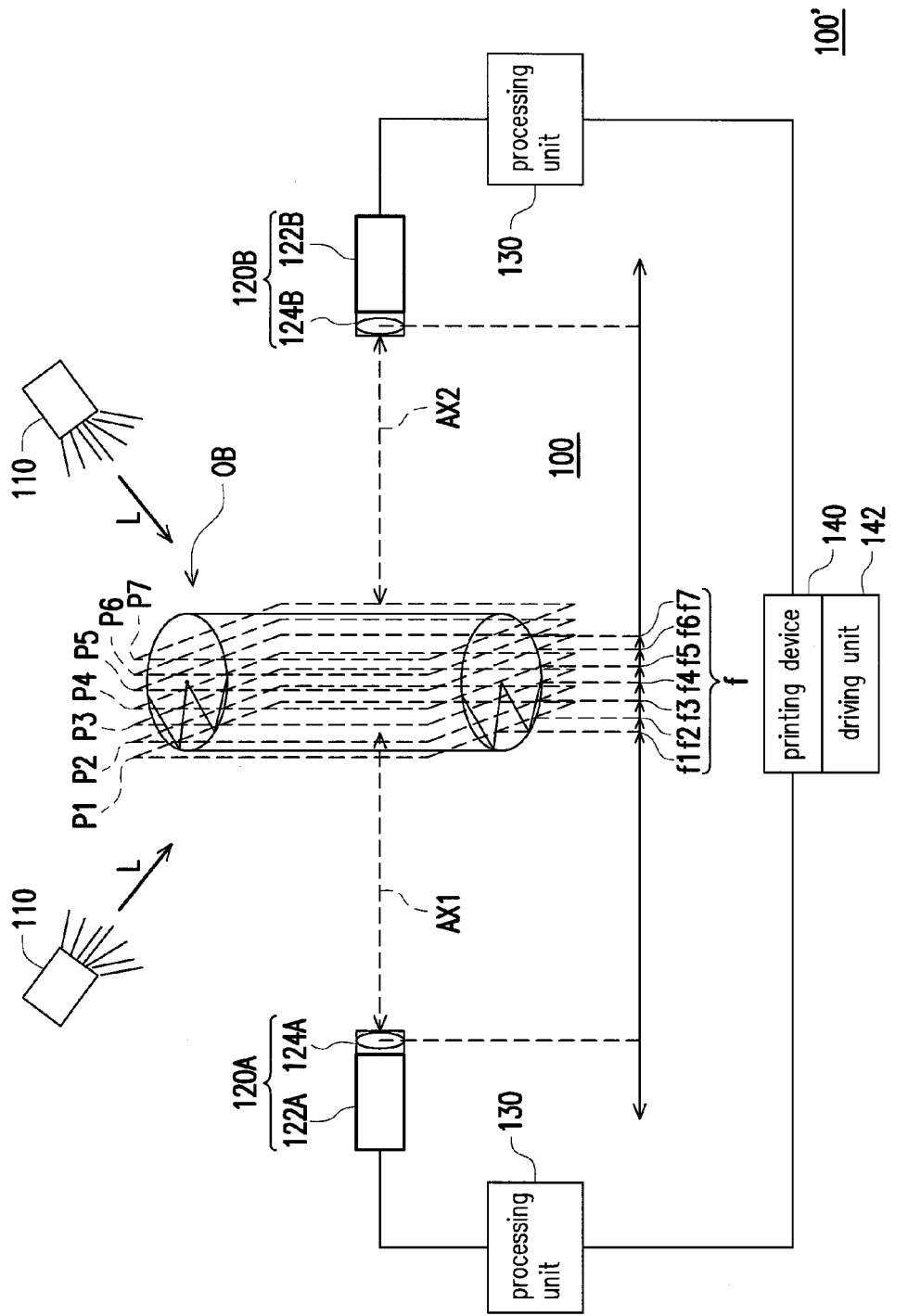
FIG. 4 is another implementation diagram of the focus-adjusting lens group in the embodiment of FIG. 1.

FIG. 4 is another implementation diagram of the focus-adjusting lens group in the embodiment of FIG. 1. Referring to FIGS. 1A and 4, a three-dimensional printing system 100' in FIG. 4 is similar to the three-dimensional printing system 100 in FIG. 1A where the same parts are marked with the same notations. In comparison with the three-dimensional printing system 100 of FIG. 1, the three-dimensional printing system 100' in FIG. 4 has two image-capturing modules 120A and 120B (each one includes two image-capturing units 122A and 122B and two focus-adjusting lens groups 124A and 124B). The two image-capturing modules 120A and 120B are respectively disposed surrounding the object to be measured OB and perform shooting on the object to be measured OB respectively with the shooting optical axis AX1 and the shooting optical axis AX2. Thus, even the object to be measured OB is opaque relatively to the illumination light L, the image-capturing modules 120A and 120B are still able to capture the entire surface profile of the object to be measured OB (for example, during shooting the images of the focus planes P1-P4 by the image-capturing module 120A, the image-capturing module 120B shoots the images of the focus planes P5-P7) without rotating the object to be measured OB relatively to the image-capturing module 120 so as to further reduce the time for capturing the surface profile. In other embodiments, it can adopt two more image-capturing modules so as to more increase the scan speed and the measurement accuracy.

The disposing positions and the quantity of the two image-capturing modules 120A and 120B are example only, which the invention is not limited to. In other embodiments, different quantity of the image-capturing modules is allowed depending on the need, and the image-capturing module can shoot the object to be measured OB in different directions (for example, in a horizontal direction, a vertical direction or an inclined direction relatively to the object to be measured OB).

Figure 5A:
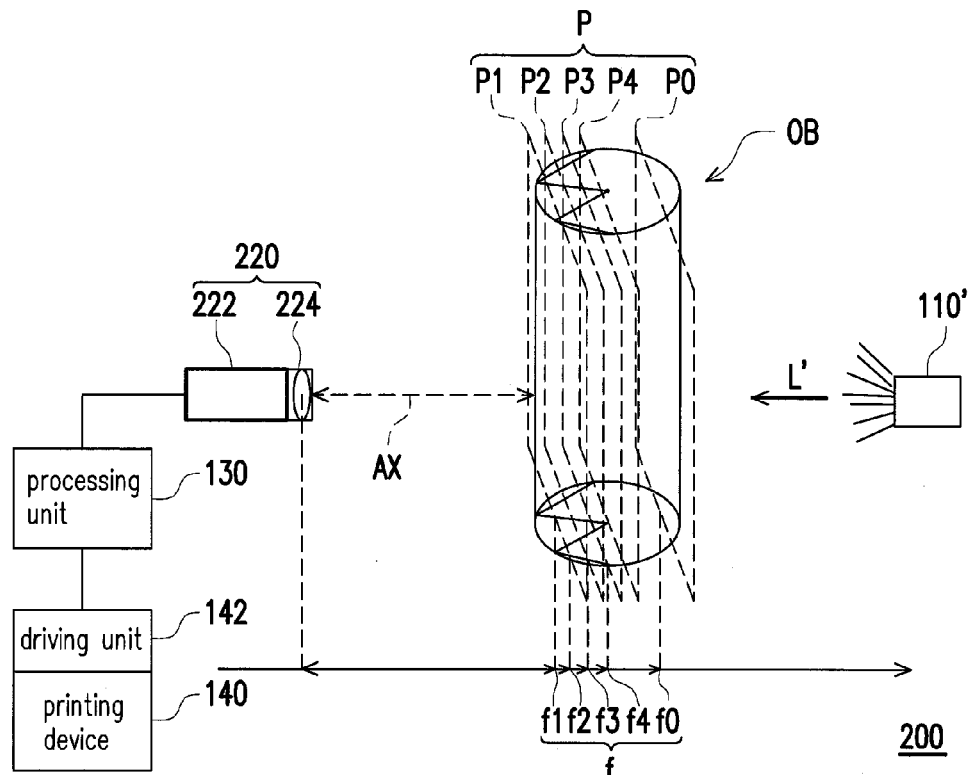
FIG. 5A is a schematic diagram of a three-dimensional printing system in the second embodiment of the invention.

FIG. 5A is a schematic diagram of a three-dimensional printing system in the second embodiment of the invention. Referring to FIGS. 1A and 5A, the three-dimensional printing system 200 is similar to the three-dimensional printing system 100 in the embodiment of FIG. 1A except that the light source unit 110' employed by the three-dimensional printing system 200 in the embodiment provides the object to be measured OB an illumination light L', the object to be measured OB is transparent relatively to the illumination light L', (for example, the illumination light L' can be an X-ray), the focused local images are the images of the overlapped portion of the object to be measured OB and the focus planes P under the different shooting focal lengths f, and the three-dimensional profile data includes an information of a surface profile and an inner shape of the object to be measured OB. In other words, in the first embodiment, only the surface profile (i.e., the shell) of the object to be measured OB is measured, while in the embodiment, since the object to be measured OB is transparent relatively to the illumination light L', the object to be measured OB is disposed between the light source unit 110' and image-capturing module 220, and the light source unit 110' is disposed opposite to the light source unit 110' relatively to the object to be measured OB, so that the illumination light L' can penetrate the object to be measured OB to be received by the image-capturing module 220 (including both the image-capturing unit 222 and the focus-adjusting lens group 224) and the inner shape of the object to be measured OB can be shot by the image-capturing module 220 as well. In this way, the fabricated reproduction not only has the surface profile the same as the object to be measured OB but also has the inner shape similar to the object to be measured OB.

In the embodiment, since the object to be measured OB is transparent relatively to the illumination light L', the illumination light L' can pass through the object to be measured OB to light the inner portion thereof (for example, the focal length can be the focal length f0). As a result, the minimal value of the shooting focal lengths is the shortest distance between the focus-adjusting lens group 224 and the object to be measured OB along the shooting optical axis AX, and the maximal value of the shooting focal lengths f is the longest distance between the focus-adjusting lens group 224 and the object to be measured OB along the shooting optical axis AX. Therefore, without rotating the object to be measured OB or employing a plurality of image-capturing modules 220, the system still can properly obtain the surface profile and the inner shape of the object to be measured OB.

As another option, in the embodiment, since the object to be measured OB is transparent relatively to the illumination light L', the focal length of the focus-adjusting lens group 224 can be fixed by adjusting the distance between the light source unit 110' and the object to be measured OB, which enables focused scanning on each cross-section of the object to be measured OB. In other words, in the embodiment, the scanning is achieved not only by changing the focal length through the focus-adjusting lens group 224, but also by adjusting the distances between the light source unit 110', the image-capturing module 220 and the object to be measured OB so as to achieve the same effect of the embodiment of FIG. 1A.

In particular, not only in the embodiment the goal of scanning the object to be measured OB can be achieved by adjusting the distances between the light source unit 110', the image-capturing module 220 and the object to be measured OB, but also in other embodiments (for example, the embodiment of FIG. 1A), the goal of scanning the object to be measured OB can be achieved by adjusting the distances between the light source unit 110, the image-capturing module 120 and the object to be measured OB. That is, the effect of scanning the object to be measured OB the same as or similar to the above-mentioned scheme (by changing the focal length through the focus-adjusting lens group 124 only) can be achieved through changing the reference point of the shooting focal length. The reference point of the shooting focal length is generally disposed on the object to be measured OB, which the invention is not limited to. In other embodiments, the reference point of the shooting focal length can be disposed on other positions, and the processing unit 130 transmits the information of the reference point to the printing device 140 so as to correctly print the reproduction of the object to be measured OB.

Figure 5B:
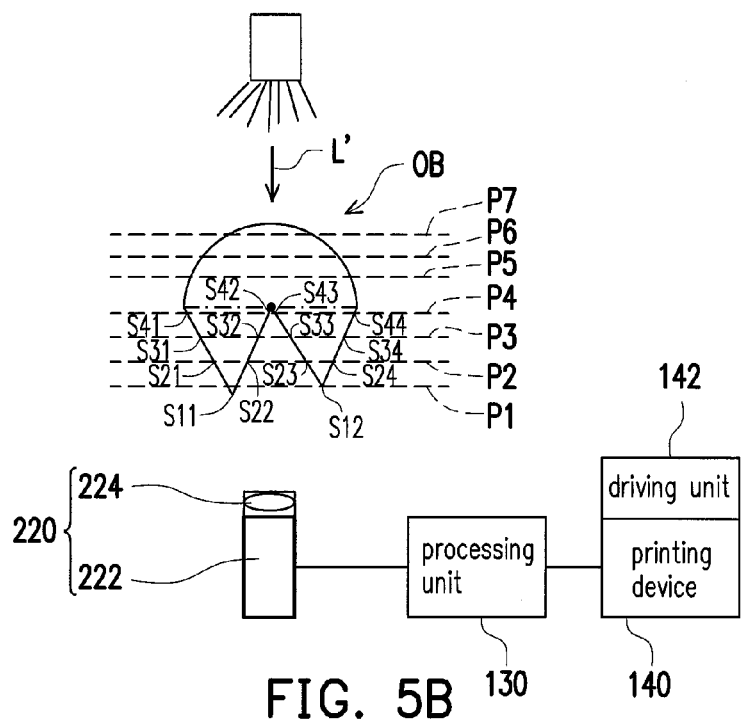
FIG. 5B is a top-view diagram of the three-dimensional printing system in the embodiment of FIG. 5A.
Figure 6A:
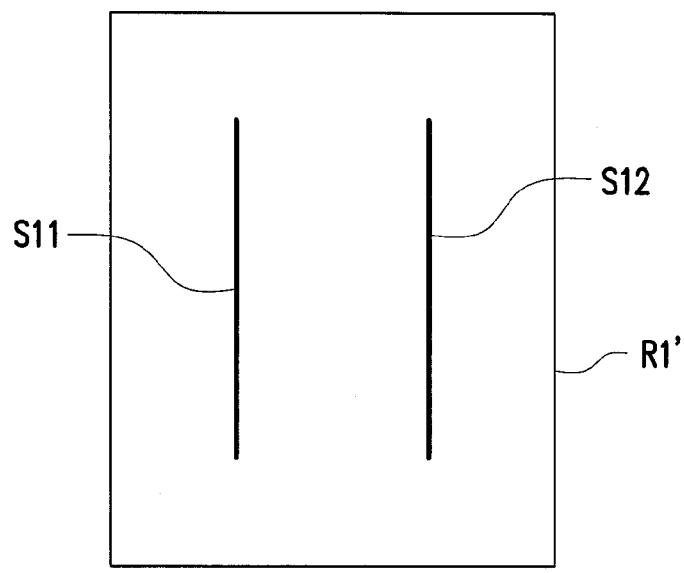
FIGS. 6A-6D are diagrams showing the images captured by the image-capturing module 220 respectively under four focal lengths f1, f2, f3 and f4.
Figure 6B:
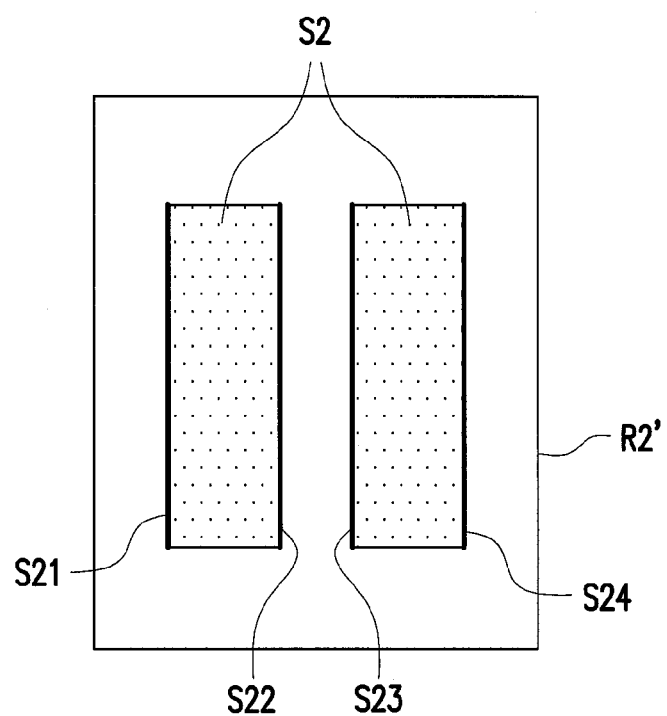
Figure 6C:
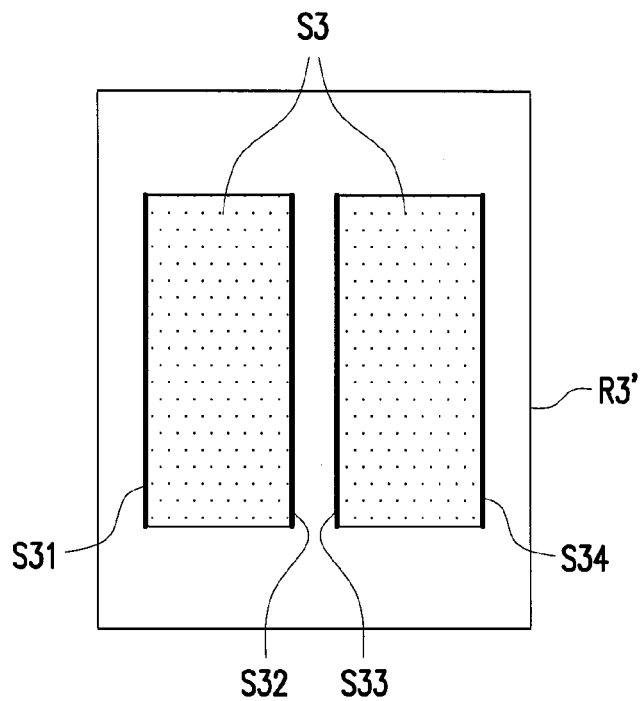
Figure 6D:
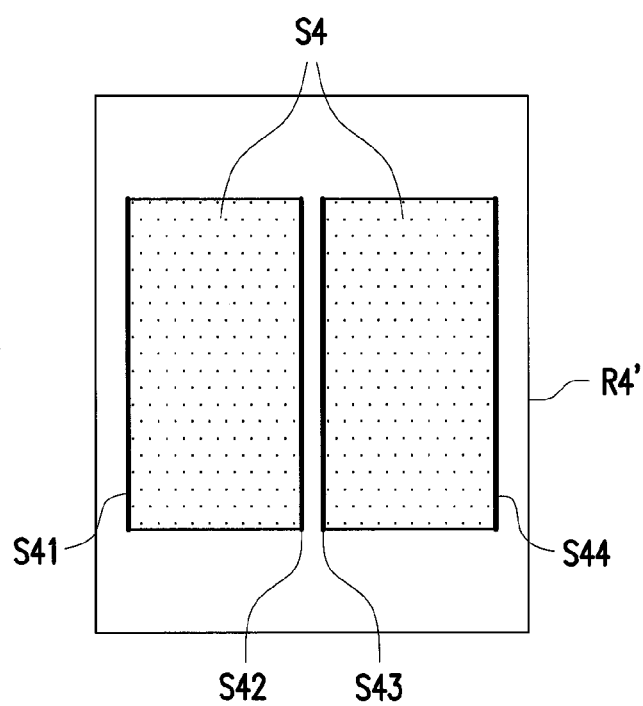

FIG. 5B is a top-view diagram of the three-dimensional printing system in the embodiment of FIG. 5A, and FIGS. 6A-6D are diagrams showing the images captured by the image-capturing module 220 respectively under four focal lengths f1, f2, f3 and f4, wherein the same or similar parts use the same notations.

Referring to FIGS. 5A-6D, in the embodiment, in comparison with the images R1, R2, R3 and R4 in FIGS. 3A-3D, the images R1', R2' R3' and R4' respectively captured by the image-capturing module 220 under the shooting focal lengths f1, f2, f3 and f4 respectively include the local images S11, S12, S21, S22, S23, S24, S31, S32, S33, S34, S41, S42, S43 and S44 of the surface of the object to be measured OB and also respectively include the clear local image S2 of the portion where the inner part of the object to be measured OB is overlapped with the focus plane P2, the clear local image S3 of the portion where the inner part of the object to be measured OB is overlapped with the focus plane P3 and the clear local image S4 of the portion where the inner part of the object to be measured OB is overlapped with the focus plane P4.

In this way, the images R1', R2', R3' and R4' are equivalent to the vertical slices of the object to be measured OB on each focus plane P. Then, the printing device 140 prints the images R1', R2', R3' and R4' in cumulative and stacked way so as to obtain the overall reproduction having the same surface profile and inner shape as the ones of the object to be measured OB, in which the detail depictions and the actions of the similar or same parts can refer to the first embodiment, which are omitted to describe.

In other implementations of the second embodiment, it can adopt two or more image-capturing modules as shown by FIG. 4 to further increase the scanning speed and the measuring accuracy.

The relative positions of the parts and the schematic graphics of the focal planes, the sizes and the proportions, the quantity and the scanning sequence in the first and second embodiments are examples only to explain the embodiment, which the invention is not limited to.

Figure 7:
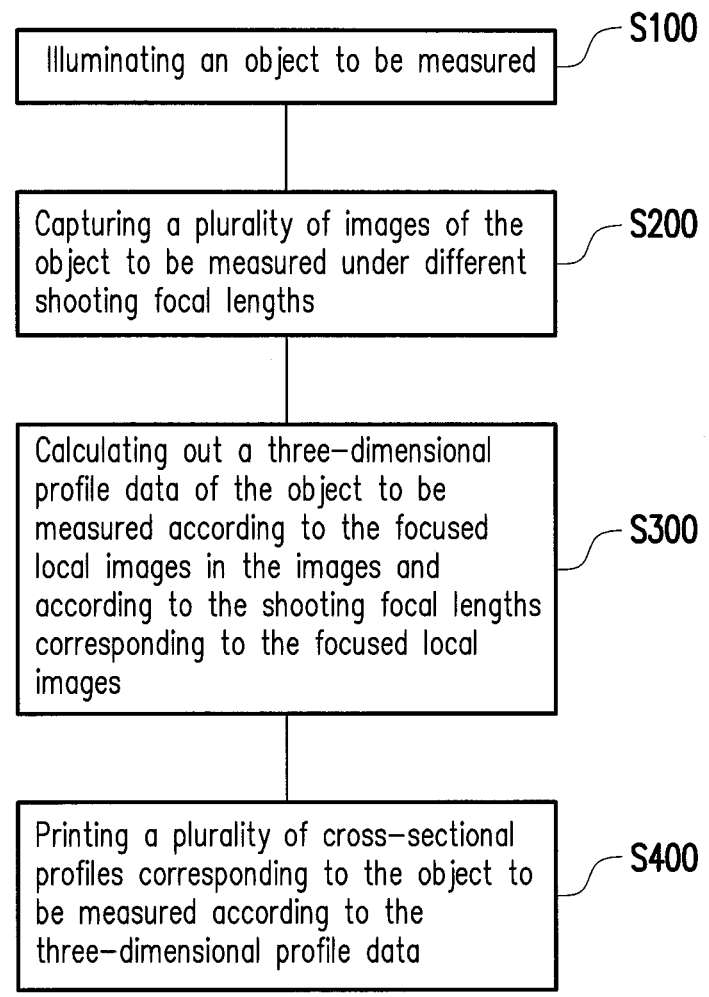
FIG. 7 is a schematic diagram of a method for three-dimensional printing according to the third embodiment of the invention.

FIG. 7 is a schematic diagram of a method for three-dimensional printing according to the third embodiment of the invention. The method includes following steps: illuminating an object to be measured OB (step S100); capturing a plurality of images of the object to be measured OB under different shooting focal lengths, in which each of the images includes a focused local image and an unfocused local image (step S200); calculating a three-dimensional profile data of the object to be measured OB according to the focused local images in the images and according to the shooting focal lengths f corresponding to the focused local images (step S300); and printing a plurality of cross-sectional profiles corresponding to the object to be measured OB according to the three-dimensional profile data (step S400). The method for three-dimensional printing in the embodiment can be implemented by employing the three-dimensional printing system in the first or second embodiment, which the invention is not limited to.

Relatively to the illumination light to light the object to be measured OB, the object to be measured OB can be opaque (such as the first embodiment), and the focused local images are images of overlapped portions of the object to be measured OB and the focus planes P under the different shooting focal lengths f, and the three-dimensional profile data includes the information of the surface profile of the object to be measured OB. In other words, the profile of the shell of the object to be measured OB can be precisely captured.

Relatively to the illumination light to light the object to be measured, the object to be measured OB can be transparent (such as the second embodiment), and the focused local images are images of overlapped portions of the object to be measured OB and the focus planes P under the different shooting focal lengths f, and the three-dimensional profile data includes the information of the surface profile and the inner shape of the object to be measured OB. In other words, the profile of the shell of the object to be measured OB together with the inner structure of the object to be measured OB can be precisely captured.

The step of capturing the plurality of images of the object to be measured under different shooting focal lengths (step S200) further includes: shooting the object to be measured OB with at least one shooting optical axis (for example, a shooting optical axis AX, two shooting optical axes AX1 and AX2 or more shooting optical axes) through at least one image-capturing module (for example, an image-capturing module 120, 220, or two image-capturing modules 120A and 120B or more image-capturing modules), wherein the minimal value of the shooting focal lengths f is the shortest distance between the focus-adjusting lens group (124, 224, 124A and 124B) of the image-capturing module (120, 220, 120A and 120B) and the object to be measured OB along the shooting optical axis (AX, AX1 and AX2), and the maximal value of the shooting focal lengths f is a distance between the focus-adjusting lens group (124, 224, 124A and 124B) and the focus plane P along the shooting optical axis (AX, AX1 and AX2) where the overlapped cross-section area of the object to be measured OB and the focus plane P is maximal. The detail shooting procedure and the detail depiction of image processing can refer to the first or second embodiment, which are omitted to describe.

In summary, the three-dimensional printing system of the invention uses focus-adjusting lens group to obtain the profile information of the object to be measured on different focus planes so as to precisely obtain the surface even the inner profile shape of the object to be measured, followed by using the printing unit to print layer by layer. In this way, the invention can accurately and effectively perform three-dimensional printing, reduce the design cost and advance the accuracy and quality of the three-dimensional printing.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A printing system, comprising:
    a light source unit, configured to illuminate a target object;
    at least one image-capturing module, comprising:
    an image-capturing unit, disposed at a side of the target object;
    and a focus-adjusting lens group, disposed between the image-capturing unit and the target object;
    a processing unit, controlling the focus-adjusting lens group to change shooting focal lengths and controlling the image-capturing unit to capture a plurality of images of the target object under the different shooting focal lengths, wherein each of the plurality of images comprises a focused local image and an unfocused local image therein, and the processing unit calculates a three-dimensional profile data of the target object by arranging the focused local images among the images based on the shooting focal lengths corresponding to the focused local images;
    and
    a printing device, printing a plurality of cross-sectional profiles of the target object according to the three-dimensional profile data, wherein the processing unit maps the three-dimensional profile data to a driving unit of the printing device by respectively mapping the focused local images among the images of the target object captured by the image-capturing unit under the different shooting focal lengths to the driving unit of the printing device, and the driving unit drives the printing device to print out, layer by layer, the plurality of cross-sectional profiles of the target object in a cumulative and stacked manner according to the mapped corresponding focused local images among the images.

2. The three-dimensional printing system as claimed in claim 1, wherein the light source unit provides the target object with an illumination light, the target object is opaque relatively to the illumination light, the focused local images are images of overlapped portions of the target object and a plurality of focus planes under the different shooting focal lengths, where the three-dimensional profile data comprises an information of a surface profile of the target object.

3. The three-dimensional printing system as claimed in claim 2, wherein the image-capturing module shoots the target object with at least one shooting optical axis, a minimal value of the shooting focal lengths is a shortest distance between the focus-adjusting lens group and the target object along the shooting optical axis, and a maximal value of the shooting focal lengths is a distance between the focus-adjusting lens group and the focus plane along the shooting optical axis when an overlapped cross-section area of the target object and the focus plane is maximal.

4. The three-dimensional printing system as claimed in claim 1, wherein the light source unit provides the target object with an illumination light, the target object is transparent relatively to the illumination light, the focused local images are images of overlapped portions of the target object and a plurality of focus planes under the different shooting focal lengths, where the three-dimensional profile data comprises an information of a surface profile and an inner shape of the target object.

5. The three-dimensional printing system as claimed in claim 4, wherein the image-capturing module shoots the target object with at least one shooting optical axis, a minimal value of the shooting focal lengths is a shortest distance between the focus-adjusting lens group and the target object along the shooting optical axis, and a maximal value of the shooting focal lengths is a longest distance between the focus-adjusting lens group and the target object along the shooting optical axis.

6. The three-dimensional printing system as claimed in claim 1, wherein the at least one image-capturing module comprises a plurality of image-capturing modules respectively disposed surrounding the target object, wherein the plurality of image-capturing modules respectively capture at least a portion of the images of the target object with different shooting optical axes.

7. The three-dimensional printing system as claimed in claim 1, wherein the driving unit performs image scaling and printing according to the focused local images among the mapped images.

8. A method for three-dimensional printing, comprising:
illuminating a target object with a light source unit;
controlling a focus-adjusting lens group, disposed between the image-capturing unit and the target object, to change shooting focal lengths
and controlling an image-capturing unit disposed at a side of the target object to capture a plurality of images of the target object under different shooting focal lengths by at least one shooting optical axis, wherein each of the images comprises a focused local image and an unfocused local image;
calculating a three-dimensional profile data of the target object by arranging the focused local images in the images based on the shooting focal lengths corresponding to the focused local images;
and
printing a plurality of cross-sectional profiles of the target object according to the three-dimensional profile data, wherein the processing unit maps the three-dimensional profile data to a driving unit of the printing device by respectively mapping the focused local images among the images of the target object captured by the image-capturing unit under the different shooting focal lengths to the driving unit of the printing device, and the driving unit drives the printing device to print out, layer by layer, the plurality of cross-sectional profiles of the target object in a cumulative and stacked manner according to the mapped corresponding focused local images among the images.

9. The method for three-dimensional printing as claimed in claim 8, wherein:
the target object is opaque relatively to the illumination light illuminating the target object, the focused local images are images of overlapped portions of the target and a plurality of focus planes under the different shooting focal lengths, where the three-dimensional profile data comprises an information of a surface profile of the target object.

10. The method for three-dimensional printing as claimed in claim 9, wherein the step of capturing the plurality of images of the target object under the different shooting focal lengths further comprises:
shooting the target object with at least one shooting optical axis through the image-capturing module, a minimal value of the shooting focal lengths is a shortest distance between the focus-adjusting lens group of the image-capturing module and the target object along the shooting optical axis, and a maximal value of the shooting focal lengths is a distance between the focus-adjusting lens group and the focus plane along the shooting optical axis when an overlapped cross-section area of the target object and the focus plane is maximal.

11. The method for three-dimensional printing as claimed in claim 8, wherein:
the target object is transparent relatively to the illumination light illuminating the target object, the focused local images are images of overlapped portions of the target object and a plurality of focus planes under the different shooting focal lengths, and the three-dimensional profile data comprises an information of a surface profile and an inner shape of the target object.

12. The method for three-dimensional printing as claimed in claim 11, wherein the step of capturing the plurality of images of the target object under the different shooting focal lengths further comprises:
shooting the target object with at least one shooting optical axis through the image-capturing module, a minimal value of the shooting focal lengths is a shortest distance between the focus-adjusting lens group of the image-capturing module and the target object along the shooting optical axis, and a maximal value of the shooting focal lengths is a longest distance between the focus-adjusting lens group and the target object along the shooting optical axis.

13. The method for three-dimensional printing as claimed in claim 8, wherein the driving unit performs image scaling and printing according to the mapped focused local images among the images.

* * * * *